United States Patent
Xiao et al.

(10) Patent No.: US 9,942,071 B2
(45) Date of Patent: Apr. 10, 2018

(54) SIGNAL PROCESSING METHOD, APPARATUS AND SIGNAL RECEIVER

(71) Applicant: Huawei Technologies Co., Ltd., Shenzhen, Guangdong (CN)

(72) Inventors: Zhiyu Xiao, Chengdu (CN); Deyuan Chang, Shenzhen (CN)

(73) Assignee: Huawei Technologies Co., Ltd., Shenzhen (CN)

(*) Notice: Subject to any disclaimer, the term of this patent is extended or adjusted under 35 U.S.C. 154(b) by 0 days.

(21) Appl. No.: 14/979,387

(22) Filed: Dec. 27, 2015

(65) Prior Publication Data
US 2016/0142235 A1    May 19, 2016

Related U.S. Application Data

(63) Continuation of application No. PCT/CN2013/078164, filed on Jun. 27, 2013.

(51) Int. Cl.
| | | |
|---|---|---|
| *H04L 1/18* | (2006.01) | |
| *H04L 27/22* | (2006.01) | |
| *H04L 27/18* | (2006.01) | |
| *H04B 10/61* | (2013.01) | |
| *H04L 1/00* | (2006.01) | |

(Continued)

(52) U.S. Cl.
CPC .......... *H04L 27/22* (2013.01); *H03M 13/336* (2013.01); *H04B 10/61* (2013.01); *H04B 10/6165* (2013.01); *H04L 1/0047* (2013.01); *H04L 1/0052* (2013.01); *H04L 27/18* (2013.01); *H04L 25/067* (2013.01); *H04L 27/223* (2013.01)

(58) Field of Classification Search
None
See application file for complete search history.

(56) References Cited

U.S. PATENT DOCUMENTS

| | | |
|---|---|---|
| 2002/0168032 A1 | 11/2002 | Legrand et al. |
| 2008/0198958 A1 | 8/2008 | Shin |
| 2009/0019335 A1 | 1/2009 | Boyer et al. |

(Continued)

FOREIGN PATENT DOCUMENTS

| | | |
|---|---|---|
| CN | 1389057 A | 1/2003 |
| CN | 102355317 A | 2/2012 |

(Continued)

OTHER PUBLICATIONS

Kazuhiko Seki et al., "Phase Ambiguity Resolver for Coherent Detection Mobile Wireless Communication Systems with a Very Low Power Consumption Viterbi Decoder employing SST Scheme", Universal Personal Communications 3rd Annual International Conference, Sep. 27-Oct. 1, 1994, p. 210-214.

Primary Examiner — Daniel McMahon

(57) ABSTRACT

The present application discloses a method for processing a signal. An apparatus detects, according to a check relationship set during a forward error correction coding, that a phase jump occurs in a data segment of a signal, and a quantity of degrees of the phase jump, performs, according to the quantity of degrees of the phase jump, a phase correction on the data segment; after the phase correction, performs a confidence correction on the data segment; and after the confidence correction, performs a forward error correction decision decoding on the data segment on which the confidence correction has been performed and output the data segment.

6 Claims, 6 Drawing Sheets

(51) Int. Cl.
*H03M 13/33* (2006.01)
*H04L 25/06* (2006.01)

(56) References Cited

U.S. PATENT DOCUMENTS

| | | |
|---|---|---|
| 2010/0138722 A1 | 6/2010 | Harley et al. |
| 2011/0029843 A1 | 2/2011 | Lu et al. |
| 2012/0096327 A1 | 4/2012 | Cai |
| 2013/0188578 A1* | 7/2013 | Touboul ............... H04W 72/04 370/329 |
| 2013/0188680 A1* | 7/2013 | Gautier ............... H04L 27/2647 375/232 |

FOREIGN PATENT DOCUMENTS

| | | |
|---|---|---|
| EP | 2 538 596 A1 | 12/2012 |
| JP | 2007068052 A | 3/2007 |

* cited by examiner

SIGNAL PROCESSING METHOD, APPARATUS AND SIGNAL RECEIVER

CROSS-REFERENCE TO RELATED APPLICATIONS

This application is a continuation of International Application No. PCT/CN2013/078164, filed on Jun. 27, 2013, which is hereby incorporated by reference in its entirety.

TECHNICAL FIELD

The present disclosure relates to the field of computers and communications technologies, and in particular, to a signal processing method, apparatus and signal receiver.

BACKGROUND

With development of communications technologies, a transmission rate of a high-speed optical fiber transmission system develops from 40 Gbit/s to 100 Gbit/s, or even to 400 Gbit/s, a coherent receiving technology is widely applied. A main structure of a coherent receiving system is shown in FIG. 1. At a transmit end, after a digital signal code stream undergoes forward error correction coding performed by a forward error correction coding module, and phase modulation performed by a phase modulation module, the digital signal code stream is sent to an optical fiber link. At a receive end, a receiving module performs coherent receiving by using the optical fiber link and performs demodulation to recover an analog baseband signal; an analog-to-digital conversion module samples the analog baseband signal, to obtain a multi-level digital signal; an equalization module performs time-domain and frequency-domain equalization on the multi-level digital signal; then, a phase estimation and recovery module performs carrier phase estimation (CPE) and recovery, on the equalized multi-level digital signal; and finally, a decision decoding module performs decoding and decision, to obtain a recovered digital signal code stream.

However, for the foregoing coherent receiving system and a similar communications system, a problem of a phase jump often occurs in the signal on which the carrier phase estimation and recovery are performed, that is, a 90-degree phase jump, −90-degree phase jump or a 180-degree phase jump occurs in a data segment of the signal obtained after the carrier phase estimation and recovery. For a communications system, a phase jump is unacceptable, because the phase jump causes continuous burst bit errors, and the segment of continuous burst bit errors greatly affects or even invalidates a function of forward error correction decoding, so that a great number of bit errors occur in the communications system.

SUMMARY

Embodiments of the present invention provide a signal processing method, apparatus and a signal receiver, so as to resolve a problem of a bit error caused by a phase jump of a signal in the prior art.

To resolve the foregoing technical problem, the embodiments of the present invention disclose the following technical solutions:

According to a first aspect, a method is provided, where the method includes the following steps:

detecting, according to a check relationship set during a forward error correction coding, that a phase jump occurs in a data segment of a signal, and a quantity of degrees of the phase jump;

performing, according to the quantity of degrees of the phase jump, phase correction on the data segment;

after the phase correction, performing confidence correction on the data segment; and after the confidence correction, performing forward error correction decision decoding on the data segment and output the data segment.

In a first possible implementation manner of the first aspect, the step of detecting comprises:

respectively performing a −90-degree phase shift, 90-degree phase shift and 180-degree phase shift on the data segment of the signal to obtain a −90-degree shifted data segment, a 90-degree shifted data segment and a 180-degree shifted data segment;

respectively calculating quantities of groups of check relationships, set during the forward error correction coding, that the data segment, the −90-degree shifted data segment, the 90-degree shifted data segment and the 180-degree shifted data segment do not meet; and comparing the quantity of groups of check relationships that the data segment does not meet, the quantity of groups of check relationships that the −90-degree shifted data segment does not meet, the quantity of groups of check relationships that the 90-degree shifted data segment does not meet, and the quantity of groups of check relationships that the 180-degree shifted data segment does not meet; and if the quantity of groups of check relationships that the data segment does not meet is the smallest, determining that no phase jump occurs in the data segment; if the quantity of groups of check relationships that the −90-degree shifted data segment does not meet is the smallest, determining that a 90-degree phase jump occurs in the data segment; if the quantity of groups of check relationships that the 90-degree shifted data segment does not meet is the smallest, determining that a −90-degree phase jump occurs in the data segment; or if the quantity of groups of check relationships that the 180-degree shifted data segment does not meet is the smallest, determining that a 180-degree phase jump occurs in the data segment.

In a second possible implementation manner of the first aspect, methods for performing the confidence correction comprise at least one of linear correction, nonlinear correction, and table lookup correction.

According to a second aspect, an apparatus is provided, comprising:

a processor; and a computer readable medium having a plurality of computer executable instructions that, when executed by the processor, cause the processor to perform the following steps:

detecting, according to a check relationship set during a forward error correction coding, that a phase jump occurs in a data segment of a signal, and a quantity of degrees of the phase jump;

performing, according to the quantity of degrees of the phase jump, a phase correction on the data segment;

after the phase correction, performing a confidence correction on the data segment; and after the confidence correction, performing a forward error correction decision decoding on the data segment and output the data segment.

In a first possible implementation manner of the second aspect, the step of detecting comprises:

respectively performing a −90-degree phase shift, 90-degree phase shift and 180-degree phase shift on the data segment of the signal to obtain a −90-degree shifted data segment, a 90-degree shifted data segment and a 180-degree shifted data segment;

respectively calculating quantities of groups of check relationships, set during the forward error correction coding, that the data segment, the −90-degree shifted data segment, the 90-degree shifted data segment and the 180-degree shifted data segment do not meet; and comparing the quantity of groups of check relationships that the data segment does not meet, the quantity of groups of check relationships that the −90-degree shifted data segment does not meet, the quantity of groups of check relationships that the 90-degree shifted data segment does not meet, and the quantity of groups of check relationships that the 180-degree shifted data segment does not meet; and if the quantity of groups of check relationships that the data segment does not meet is the smallest, determining that no phase jump occurs in the data segment; if the quantity of groups of check relationships that the −90-degree shifted data segment does not meet is the smallest, determining that a 90-degree phase jump occurs in the data segment; if the quantity of groups of check relationships that the 90-degree shifted data segment does not meet is the smallest, determining that a −90-degree phase jump occurs in the data segment; or if the quantity of groups of check relationships that the 180-degree shifted data segment does not meet is the smallest, determining that a 180-degree phase jump occurs in the data segment.

In a second possible implementation manner of the second aspect, methods for the confidence correction comprise at least one of linear correction, nonlinear correction, and table lookup correction.

In at least one of the embodiments of the present invention, a quantity of degrees of a phase jump occurring in a data segment of a signal is detected, phase correction is performed on the data segment according to the quantity of degrees of the phase jump, so as to eliminate an impact of the phase jump, and confidence correction is performed on the data segment in which the phase jump occurs and on which the phase correction has been performed, which greatly reduces impact of a phase jump misjudgment on decision decoding, thereby resolving a problem of a bit error caused by the phase jump.

BRIEF DESCRIPTION OF THE DRAWINGS

To describe the technical solutions in the embodiments of the present invention or in the prior art more clearly, the following briefly introduces the accompanying drawings required for describing the embodiments or the prior art. Apparently, the accompanying drawings in the following description show some embodiments of the present invention, and a person of ordinary skill in the art may still derive other drawings from these accompanying drawings without creative efforts.

DETAILED DESCRIPTION

To make the objectives, technical solutions, and advantages of the embodiments of the present invention clearer, the following clearly describes the technical solutions in the embodiments of the present invention with reference to the accompanying drawings in the embodiments of the present invention. Apparently, the described embodiments are a part rather than all of the embodiments of the present invention. All other embodiments obtained by a person of ordinary skill in the art based on the embodiments of the present invention without creative efforts shall fall within the protection scope of the present invention.

Specific implementation manners of the present invention are further described in detail below with reference to the accompanying drawings and embodiments. The following embodiments are intended to describe the present invention, but not to limit the scope of the present invention.

Figure 1:
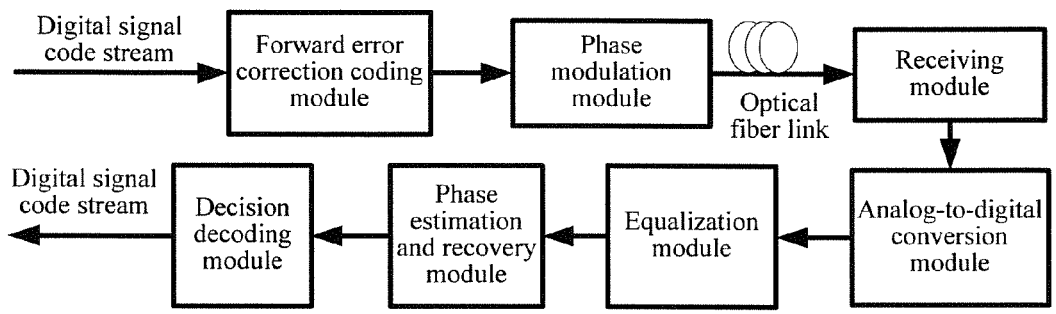
FIG. 1 is a structural diagram of a coherent receiving system according to the prior art.
Figure 2:
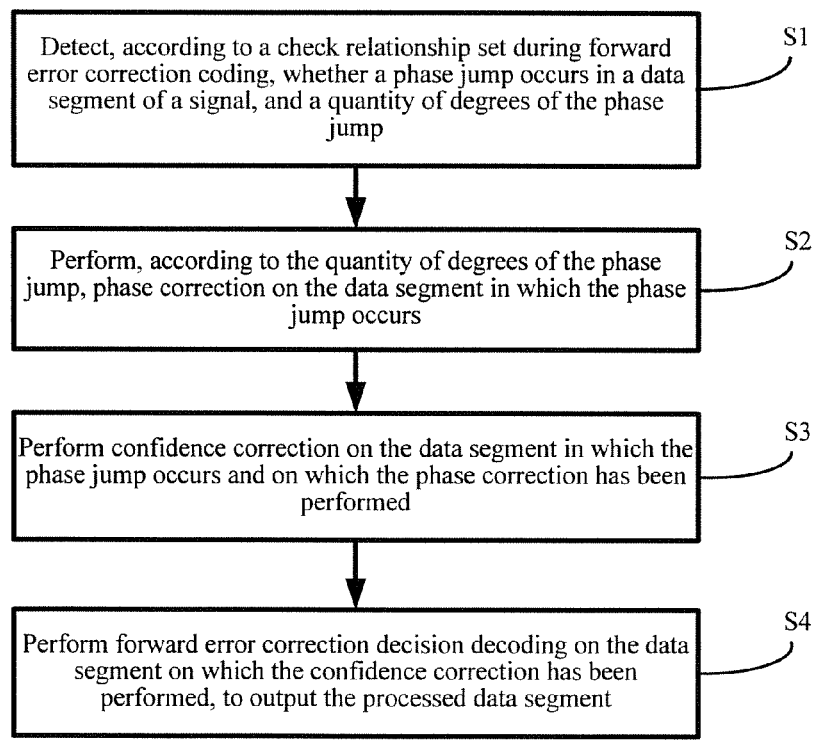
FIG. 2 is a flowchart of a signal processing method according to an embodiment of the present invention.

As shown in FIG. 2, a signal processing method provided in a first aspect includes the following steps:

S1: Detect, according to a check relationship set during forward error correction coding, whether a phase jump occurs in a data segment of a signal, and a quantity of degrees of the occurring phase jump.

In a communications system, a communications signal is encapsulated into several data segments for transmission. At a transmit end, when forward error correction coding is performed on the signal, generally, several groups of check relationships are set for each data segment of the signal, so that a receive end checks correctness of data transmission. After receiving the data segment, the receive end performs, according to the several check relationships, check on the received data segment. The smaller the quantity of groups of check relationships that the data segment does not meet, the higher the correct transmission rate of the data segment reaches.

Figure 3:
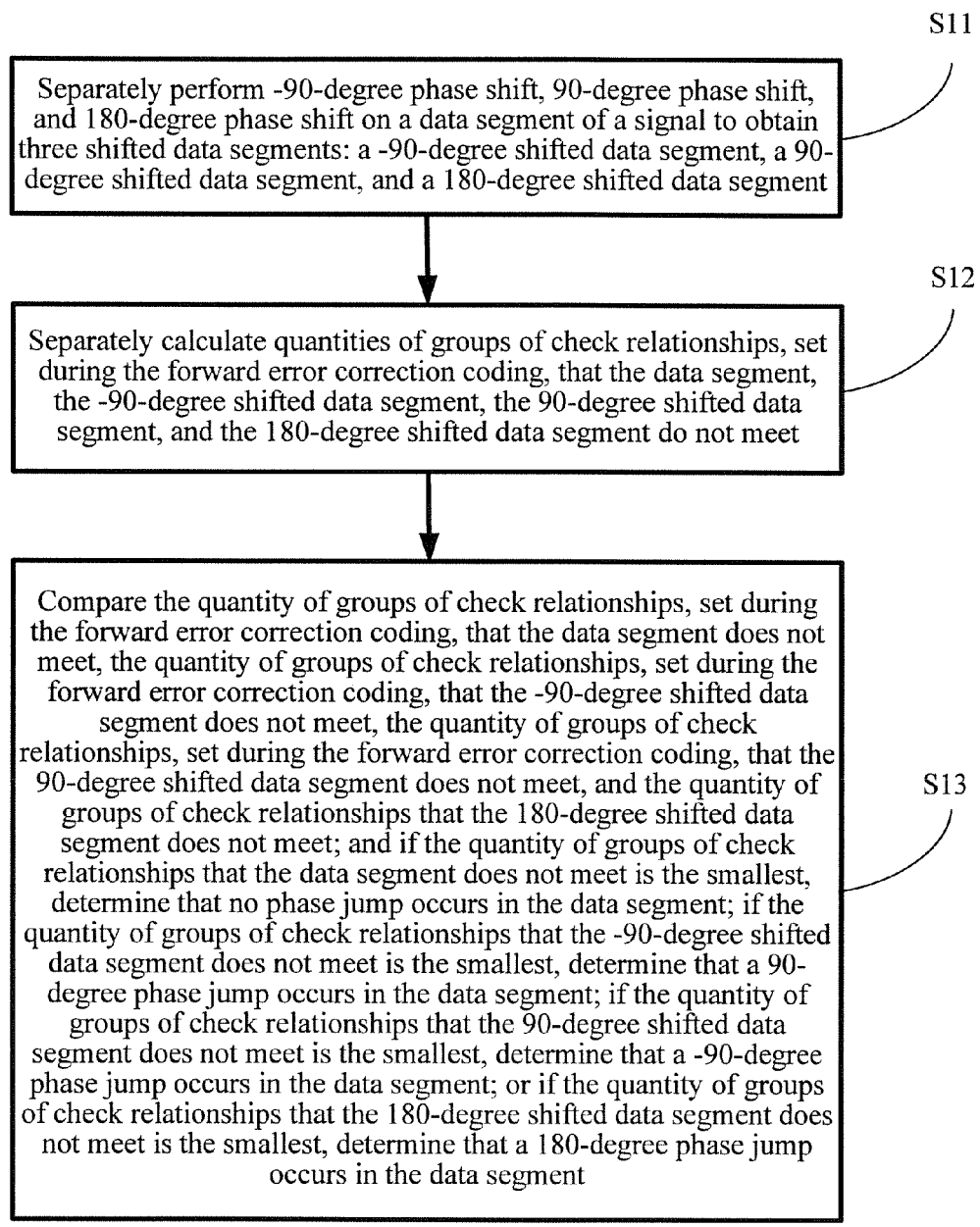
FIG. 3 is a flowchart of step S1 of a signal processing method according to an embodiment of the present invention.

Based on the foregoing principle, as shown in FIG. 3, step S1 may be implemented by the following steps:

S11: Separately perform −90-degree phase shift, 90-degree phase shift, and 180-degree phase shift on the data segment of the signal to obtain three shifted data segments: a −90-degree shifted data segment, a 90-degree shifted data segment, and a 180-degree shifted data segment.

S12: Separately calculate quantities of groups of check relationships, set during the forward error correction coding, that the data segment, the −90-degree shifted data segment, the 90-degree shifted data segment, and the 180-degree shifted data segment do not meet.

S13: Compare the quantity of groups of check relationships, set during the forward error correction coding, that the data segment does not meet, the quantity of groups of check relationships, set during the forward error correction coding, that the −90-degree shifted data segment does not meet, the quantity of groups of check relationships, set during the forward error correction coding, that the 90-degree shifted data segment does not meet, and the quantity of groups of check relationships that the 180-degree shifted data segment does not meet, and if the quantity of groups of check relationships that the data segment does not meet is the smallest, determine that no phase jump occurs in the data segment; if the quantity of groups of check relationships that the −90-degree shifted data segment does not meet is the smallest, determine that a 90-degree phase jump occurs in the data segment; if the quantity of groups of check relationships that the 90-degree shifted data segment does not meet is the smallest, determine that a −90-degree phase jump occurs in the data segment; or if the quantity of groups of check relationships that the 180-degree shifted data segment does not meet is the smallest, determine that a 180-degree phase jump occurs in the data segment.

S2: Perform, according to the quantity of degrees of the phase jump, phase correction on the data segment in which the phase jump occurs.

A phase correction manner of step S2 is as follows:

If the −90-degree phase jump occurs in the data segment, a phase of the data segment is shifted by 90 degrees, so as to compensate for the −90-degree phase jump;

If the 90-degree phase jump occurs in the data segment, the phase of the data segment is shifted by −90 degrees, so as to compensate for the 90-degree phase jump; and If the 180-degree phase jump occurs in the data segment, the phase of the data segment is shifted by 180 degrees, so as to compensate for the 180-degree phase jump.

S3: Perform confidence correction on the data segment in which the phase jump occurs and on which the phase correction has been performed.

Confidence refers to reliability of a data segment, Confidence correction refers to reduction of confidence of a data segment in which a phase jump occurs. Because in subsequent forward error correction decision decoding, decoding is performed based on the confidence of the data segment, the confidence correction enables correct determining of the reliability of the data segment in a process of the subsequent forward error correction decision decoding, which enhances credibility of the subsequent forward error correction decision decoding, thereby resolving a problem of a bit error caused by a phase jump. Moreover, the phase correction and the confidence correction are performed on the data segment in which the phase jump occurs, and therefore, when the phase jump is detected, it tends to approach, as much as possible, a principle that wrong detection is allowed, but missed detection is not allowed.

A confidence correction algorithm is much related to a subsequent forward error correction decision decoding algorithm, and generally, the confidence correction algorithm includes linear correction, nonlinear correction, and table lookup correction.

A formula of the linear correction may be:

$$LLR_{out}=LLR_{in} \times k$$

$LLR_{out}$ is corrected confidence, $LLR_{in}$ is confidence before the correction, and k is a correction coefficient. That is, the corrected confidence equals the confidence before the correction multiplied by the correction coefficient k.

A formula of the nonlinear correction may be:

$$LLR_{out}=LLR_{in}^{k}$$

$LLR_{out}$ is corrected confidence, $LLR_{in}$ is confidence before the correction, and k is a correction coefficient. That is, the corrected confidence equals the confidence before the correction raised to the power of the correction coefficient.

A formula of the table lookup correction may be:

$$LLR_{out}=LUT(LLR_{in})$$

$LLR_{out}$ is corrected confidence, $LLR_{in}$ is confidence before the correction, and LUT is a confidence correction table. That is, the corrected confidence equals a confidence value that matches the confidence before the correction obtained by looking up the confidence correction table.

In the foregoing three confidence correction manners, the linear correction is simple and common, the nonlinear correction is complicated and applicable to a special scenario, and the table lookup correction is applicable to any confidence correction.

S4: Perform forward error correction decision decoding on the data segment on which the confidence correction has been performed, to output the processed data segment.

The method for performing the forward error correction decision decoding in step S4 is consistent with a method for forward error correction decision decoding in the prior art, and details are not described herein again.

Figure 4:
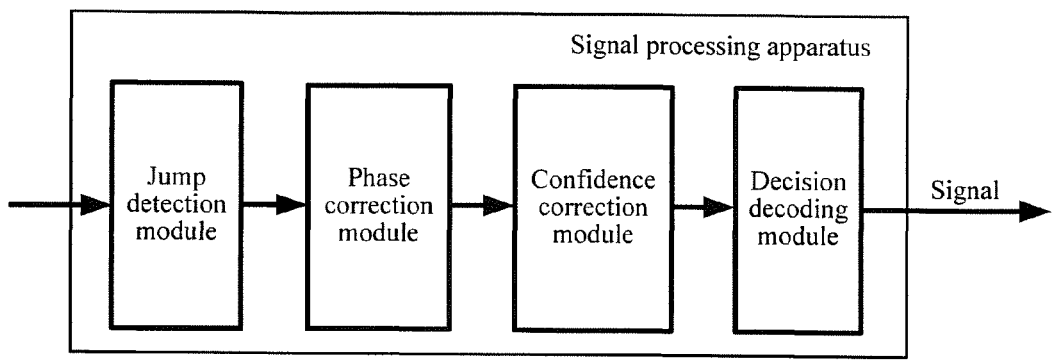
FIG. 4 is a structural diagram of a signal processing apparatus according to an embodiment of the present invention.

As shown in FIG. 4, a signal processing apparatus provided in a second aspect includes the following modules:

a jump detection module, configured to detect, according to a check relationship set during forward error correction coding, whether a phase jump occurs in a data segment of a signal, and a quantity of degrees of the occurring phase jump;

a phase correction module, configured to perform, according to the quantity of degrees of the phase jump, phase correction on the data segment in which the phase jump occurs;

a confidence correction module, configured to perform confidence correction on the data segment in which the phase jump occurs and on which the phase correction has been performed; and a decision decoding module, configured to perform forward error correction decision decoding on the data segment on which the confidence correction has been performed, to output the processed data segment.

Figure 5:
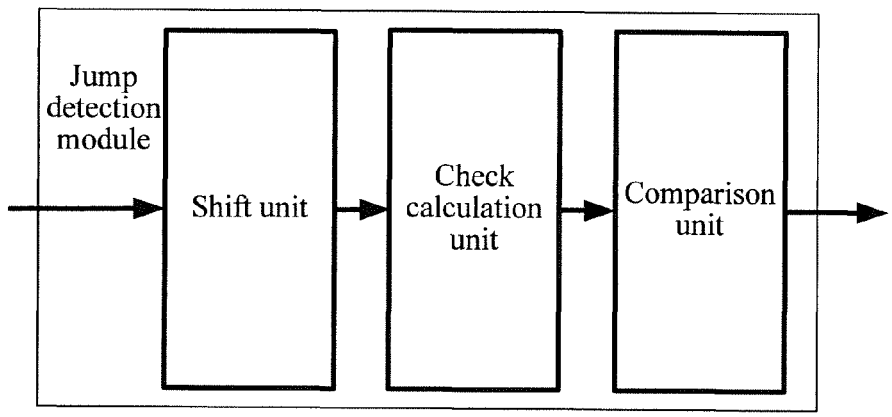
FIG. 5 is a structural diagram of a jump detection module of a signal processing apparatus according to an embodiment of the present invention.

As shown in FIG. 5, the jump detection module may include:

a shift unit, configured to separately perform −90-degree phase shift, 90-degree phase shift, and 180-degree phase shift on the data segment of the signal to obtain three shifted data segments: a −90-degree shifted data segment, a 90-degree shifted data segment, and a 180-degree shifted data segment;

a check calculation unit, configured to separately calculate quantities of groups of check relationships, set during the forward error correction coding, that the data segment, the −90-degree shifted data segment, the 90-degree shifted data segment, and the 180-degree shifted data segment do not meet; and a comparison unit, configured to compare: the quantity of groups of check relationships, set during the forward error correction coding, that the data segment does not meet, the quantity of groups of check relationships, set during the forward error correction coding, that the −90-degree shifted data segment does not meet, the quantity of groups of check relationships, set during the forward error correction coding, that the 90-degree shifted data segment does not meet, and the quantity of groups of check relationships that the 180-degree shifted data segment does not meet; and if the quantity of groups of check relationships that the data segment does not meet is the smallest, determine that no phase jump occurs in the data segment; if the quantity of groups of check relationships that the −90-degree shifted data segment does not meet is the smallest, determine that a 90-degree phase jump occurs in the data segment; if the quantity of groups of check relationships that the 90-degree shifted data segment does not meet is the smallest, determine that a −90-degree phase jump occurs in the data segment; or if the quantity of groups of check relationships that the 180-degree shifted data segment does not meet is the smallest, determine that a 180-degree phase jump occurs in the data segment.

Methods used by the confidence correction module to perform the confidence correction on the data segment in which the phase jump occurs and on which the phase correction has been performed may include linear correction, nonlinear correction, and table lookup correction.

A signal receiver provided in a third aspect includes a signal recovery apparatus and the signal processing apparatus described in the second aspect.

The signal recovery apparatus includes:

a receiving module, configured to receive a signal, and recover an analog baseband signal;

an analog-to-digital conversion module, configured to convert the analog baseband signal into a multi-level digital signal;

an equalization module, configured to perform time-domain and frequency-domain equalization on the multi-level digital signal; and a phase estimation and recovery module, configured to perform phase estimation on the multi-level digital signal, and then recover a signal, where the phase estimation and recovery module is connected to the signal processing apparatus, and the signal recovered by the phase estimation and recovery module is sent to the signal processing apparatus for processing.

Further, embodiments of the present invention are described as follows.

Figure 6:
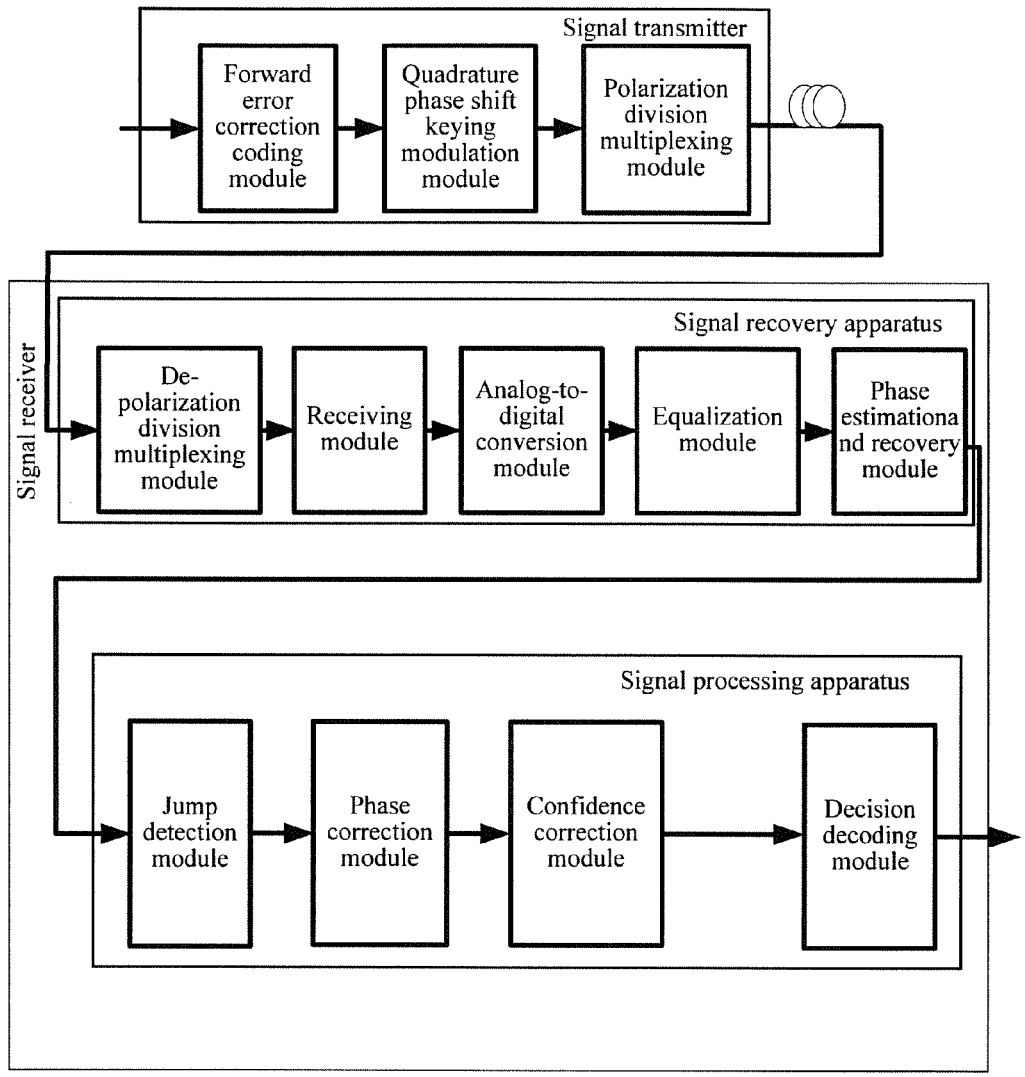
FIG. 6 is a structural diagram of a communications system according to an embodiment of the present invention.

A signal receiver of this embodiment is used for a high-speed optical fiber transmission system of polarization division multiplexing-quadrature phase shift keying (PDM-QPSK). As shown in FIG. 6, a communications system includes a signal transmitter and the signal receiver.

The signal transmitter includes a forward error correction coding module, a quadrature phase shift keying (QPSK) modulation module, and a polarization division multiplexing module, where the forward error correction coding module is configured to perform forward error correction coding on an input code stream, to output a code stream with forward error correction overheads; the quadrature phase shift keying modulation module is configured to perform quadrature phase shift keying modulation on the code stream after the forward error correction coding; and the polarization division multiplexing module is configured to perform polarization division multiplexing processing on the code stream on which the quadrature phase shift keying modulation has been performed, and send the code stream to an optical fiber link.

The signal receiver includes a signal recovery apparatus and a signal processing apparatus.

The signal recovery apparatus includes a de-polarization division multiplexing module, a receiving module, an analog-to-digital conversion module, an equalization module, and a phase estimation and recovery module. The de-polarization division multiplexing module, corresponding to the polarization division multiplexing module of the signal transmitter, is configured to perform de-polarization division multiplexing processing; the receiving module is configured to perform coherent reception, to output an analog baseband electrical signal; the analog-to-digital conversion module is configured to sample the analog baseband electrical signal, to output a multi-level digital signal; the equalization module is configured to perform frequency-domain and time-domain equalization on the multi-level digital signal; and the phase estimation and recovery module is configured to perform carrier phase estimation, to recover a phase of data and output a signal in which a phase jump may occur.

The signal processing apparatus includes a jump detection module, a phase correction module, a confidence correction module, and a decision decoding module. The foregoing modules are the same as the modules of the signal processing apparatus provided in the present disclosure, where the confidence correction module performs confidence correction in a manner of table lookup correction.

Figure 7:
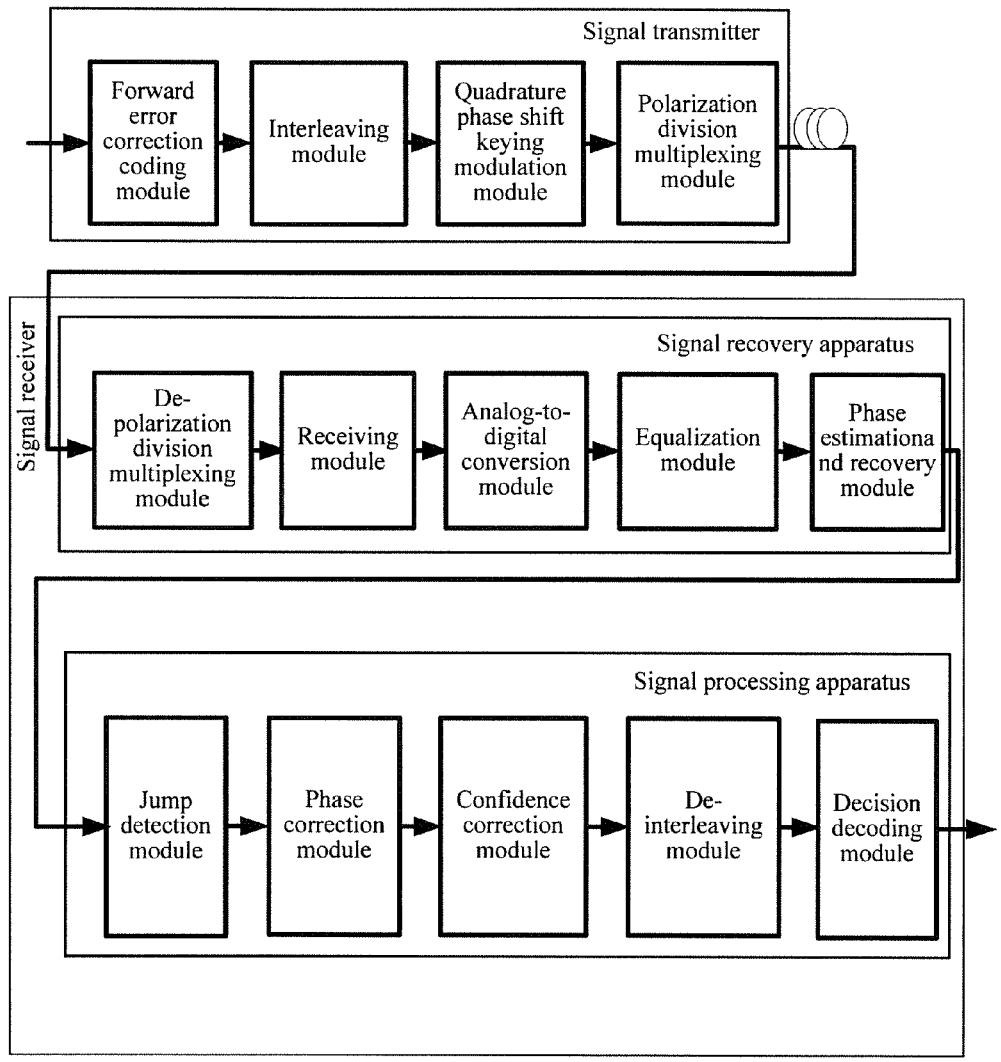
FIG. 7 is a structural diagram of a communications system including an interleaving module and a de-interleaving module according to an embodiment of the present invention.

As shown in FIG. 7, the signal transmitter of the foregoing communications system may further include an interleaving module, and the signal processing apparatus of the signal receiver may further include a de-interleaving module. Specific structures are as follows:

The signal transmitter includes a forward error correction coding module, an interleaving module, a quadrature phase shift keying (QPSK) modulation module, and a polarization division multiplexing module. The forward error correction coding module is configured to perform forward error correction coding on an input code stream, to output a code stream with forward error correction overheads; the interleaving module, corresponding to the de-interleaving module at an end of the signal receiver, is configured to perform interleaving processing on the code stream output by the forward error correction coding module; the quadrature phase shift keying modulation module is configured to perform quadrature phase shift keying modulation on the code stream on which the interleaving processing has been performed; and the polarization division multiplexing module is configured to perform polarization division multiplexing processing on the code stream on which the quadrature phase shift keying modulation has been performed, and send the code stream to an optical fiber link.

The signal receiver includes a signal recovery apparatus and the signal processing apparatus.

The signal recovery apparatus includes a de-polarization division multiplexing module, a receiving module, an analog-to-digital conversion module, an equalization module, and a phase estimation and recovery module. The de-polarization division multiplexing module, corresponding to the polarization division multiplexing module of the signal transmitter, is configured to perform de-polarization division multiplexing processing; the receiving module is configured to perform coherent reception, to output an analog baseband electrical signal; the analog-to-digital conversion module is configured to sample the analog baseband electrical signal, to output a multi-level digital signal; the equalization module is configured to perform frequency-domain and time-domain equalization on the multi-level digital signal; and the phase estimation and recovery module is configured to perform carrier phase estimation, to recover a phase of data and output a signal in which a phase jump may occur.

The signal processing apparatus includes a jump detection module, a phase correction module, a confidence correction module, the de-interleaving module, and a decision decoding module, where the de-interleaving module is configured to perform de-interleaving processing on the data segment after confidence correction. The de-interleaving processing is to perform decentralized processing on continuous input data, to decentralize a segment of burst data into multiple segments of data by selecting a proper interleaving depth, thereby eliminating impact of continuous errors on forward error correction soft-decision decoding. Other modules in the apparatus are the same as the modules of the signal processing apparatus provided in the present disclosure, where the confidence correction module performs confidence correction in a manner of table lookup correction.

Figure 8:
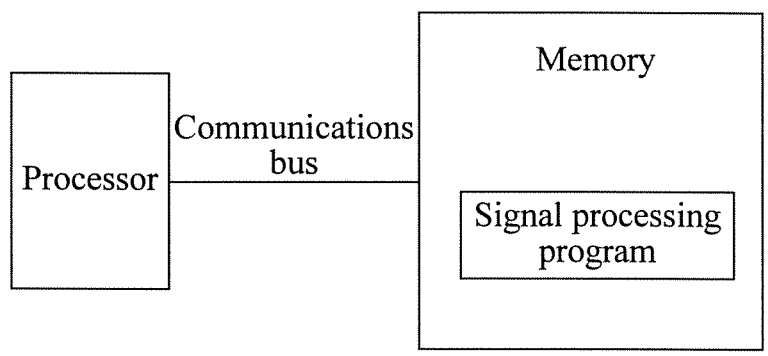
FIG. 8 is a structural diagram of a signal processing apparatus according to an embodiment of the present invention.

Further, the signal processing apparatus of this embodiment may be shown in FIG. 8, which includes at least one processor, at least one memory, and at least one communications bus, where the communications bus is used for a connection and communication between the memory and the processor. The processor is configured to execute an executable module stored in the memory, for example, a computer program. The memory may include a high-speed random access memory (RAN), and may also further include a non-volatile memory (non-volatile memory), for example, at least one magnetic disk memory.

In some implementation manners, the memory stores a signal processing program, where the signal processing program may be executed by the processor, and the signal processing program includes:

detecting, according to a check relationship set during forward error correction coding, whether a phase jump occurs in a data segment of a signal, and a quantity of degrees of the occurring phase jump; performing, according to the quantity of degrees of the phase jump, phase correction on the data segment in which the phase jump occurs; performing confidence correction on the data segment in which the phase jump occurs and on which the phase correction has been performed; and performing forward error correction decision decoding on the data segment on which the confidence correction has been performed, to output the processed data segment.

A person of ordinary skill in the art may understand that, each aspect of the present invention or a possible implementation manner of each aspect may be specifically implemented as a system, a method, or a computer program product. Therefore, each aspect of the present invention or a possible implementation manner of each aspect may use forms of hardware only embodiments, software only embodiments (including firmware, resident software, and the like), or embodiments with a combination of software and hardware, which are uniformly referred to as "circuit", "module", or "system" herein. In addition, each aspect of the present invention or the possible implementation manner of each aspect may take a form of a computer program product, where the computer program product refers to computer-readable program code stored in a computer-readable medium.

The computer-readable medium may be a computer-readable signal medium or a computer-readable storage medium. The computer-readable storage medium includes but is not limited to an electronic, magnetic, optical, electromagnetic, infrared, or semi-conductive system, device, or apparatus, or any appropriate combination thereof, such as a random access memory (RAM), a read-only memory (ROM), an erasable programmable read only memory (EPROM or flash memory), an optical fiber, and a compact disc read only memory (CD-ROM).

A processor in a computer reads computer-readable program code stored in a computer-readable medium, so that the processor can perform a function and an action specified in each step or a combination of steps in a flowchart; an apparatus is generated to implement a function and an action specified in each block or a combination of blocks in a block diagram.

All computer-readable program code may be executed on a user computer, or some may be executed on a user computer as a standalone software package, or some may be executed on a computer of a user while some is executed on a remote computer, or all the code may be executed on a remote computer or a server. It should also be noted that, in some alternative implementation solutions, each step in the flowcharts or functions specified in each block in the block diagrams may not occur in the illustrated order. For example, two consecutive steps or two blocks in the illustration, which are dependent on an involved function, may in fact be executed substantially at the same time, or these blocks may sometimes be executed in reverse order.

What is claimed is:

1. A signal processing method, comprising:

receiving, by a coherent receiving interface of an optical receiver, an optical signal from an optical fiber;

performing, by a demodulator of the optical receiver, demodulation on the optical signal to obtain an analog baseband electrical signal;

performing, by an analog-digital converter, sampling on the analog baseband electrical signal to obtain a multi-level digital electrical signal;

performing, by a processor of the optical receiver, a −90-degree phase shift, a 90-degree phase shift, and a 180-degree phase shift on a data segment of the digital electrical signal to obtain a −90-degree shifted data segment, a 90-degree shifted data segment, and a 180-degree shifted data segment, respectively;

calculating, by the processor, quantities of groups of check relationships, determined during forward error correction coding, that the data segment, the −90-degree shifted data segment, the 90-degree shifted data segment and the 180-degree shifted data segment do not meet;

comparing, by the processor, the quantity of groups of check relationships that the data segment does not meet, the quantity of groups of check relationships that the −90-degree shifted data segment does not meet, the quantity of groups of check relationships that the 90-degree shifted data segment does not meet, and the quantity of groups of check relationships that the 180-degree shifted data segment does not meet;

determining, by the processor based on the comparison of the quantities of groups of check relationships, whether a phase jump occurs in the data segment, and, if the phase jump occurs, a quantity of degrees of the phase jump;

performing, by the processor according to the quantity of degrees of the phase jump, a phase correction on the data segment;

after performing the phase correction, performing, by the processor, a confidence correction on the data segment; and after performing the confidence correction, performing, by the processor, a forward error correction decision decoding on the data segment and outputting a decoded electrical data segment.

2. The signal processing method according to claim 1, wherein determining whether the phase jump occurs in the data segment, and, if the phase jump occurs, a quantity of degrees of the phase jump comprises:

if the quantity of groups of check relationships that the data segment does not meet is the smallest, determining that no phase jump occurs in the data segment; if the quantity of groups of check relationships that the −90-degree shifted data segment does not meet is the smallest, determining that a 90-degree phase jump occurs in the data segment; if the quantity of groups of check relationships that the 90-degree shifted data segment does not meet is the smallest, determining that a −90-degree phase jump occurs in the data segment; or if the quantity of groups of check relationships that the 180-degree shifted data segment does not meet is the smallest, determining that a 180-degree phase jump occurs in the data segment.

3. The signal processing method according to claim 1, wherein performing the confidence correction comprises at least one of linear correction, nonlinear correction, and table lookup correction.

4. An optical receiver, comprising:
a coherent receiving interface configured to receive an optical signal from an optical fiber;
a demodulator configured to perform demodulation on the optical signal to obtain an analog baseband electrical signal;
an analog-digital converter configured to sample on the analog baseband electrical signal to obtain a multi-level digital electrical signal;
a processor; and
a non-transitory computer readable medium having a plurality of computer executable instructions that, when executed by the processor, cause the processor to:
perform a −90-degree phase shift, a 90-degree phase shift, and a 180-degree phase shift on a data segment of the digital electrical signal to obtain a −90-degree shifted data segment, a 90-degree shifted data segment, and a 180-degree shifted data segment, respectively;
calculate quantities of groups of check relationships, determined during forward error correction coding, that the data segment, the −90-degree shifted data segment, the 90-degree shifted data segment and the 180-degree shifted data segment do not meet;
compare the quantity of groups of check relationships that the data segment does not meet, the quantity of groups of check relationships that the −90-degree shifted data segment does not meet, the quantity of groups of check relationships that the 90-degree shifted data segment does not meet, and the quantity of groups of check relationships that the 180-degree shifted data segment does not meet;
determine, based on the comparison of the quantities of groups of check relationships, whether a phase jump occurs in the data segment, and, if the phase jump occurs, a quantity of degrees of the phase jump;
perform, according to the quantity of degrees of the phase jump, a phase correction on the data segment,
after performing the phase correction, perform a confidence correction on the data segment, and
after performing the confidence correction, perform a forward error correction decision decoding on the data segment on which the confidence correction has been performed and output a decoded electrical data segment.

5. The optical receiver according to claim 4, wherein the computer executable instructions that, when executed by the processor, further cause the processor to:
if the quantity of groups of check relationships that the data segment does not meet is the smallest, determine that no phase jump occurs in the data segment; if the quantity of groups of check relationships that the −90-degree shifted data segment does not meet is the smallest, determine that a 90-degree phase jump occurs in the data segment; if the quantity of groups of check relationships that the 90-degree shifted data segment does not meet is the smallest, determine that a −90-degree phase jump occurs in the data segment; or if the quantity of groups of check relationships that the 180-degree shifted data segment does not meet is the smallest, determine that a 180-degree phase jump occurs in the data segment.

6. The optical receiver according to claim 4, wherein the confidence correction comprises at least one of linear correction, nonlinear correction, and table lookup correction.

* * * * *